United States Patent [19]
Malinowski et al.
[11] 3,716,808
[45] Feb. 13, 1973

[54] BANDPASS FILTER INCLUDING MONOLITHIC CRYSTAL ELEMENTS WITH RESONATING PORTIONS SELECTED FOR SYMMETRICAL RESPONSE

[75] Inventors: Stanley Malinowski, Park Ridge; James L. Dailing, Glen Ellyn; Craig P. Smith, Addison, all of Ill.

[73] Assignee: Motorola, Inc., Franklin Park, Ill.

[22] Filed: May 20, 1971

[21] Appl. No.: 145,206

[52] U.S. Cl. .......... 333/72
[51] Int. Cl. .......... H03h 7/10, H03h 7/00
[58] Field of Search .......... 333/71, 72

[56] References Cited

UNITED STATES PATENTS

| | | | |
|---|---|---|---|
| 3,609,601 | 9/1971 | Phillips | 333/72 |
| 3,585,537 | 6/1971 | Rennick | 333/72 |
| 3,517,350 | 6/1970 | Beaver | 333/72 |

*Primary Examiner*—Herman Karl Saalbach
*Assistant Examiner*—Saxfield Chatmon, Jr.
*Attorney*—Mueller & Aichele

[57] ABSTRACT

A bandpass filter circuit includes a pair of dual coupled monolithic crystal filter elements each formed by a wafer of quartz, or other piezoelectric material, with two pairs of electrodes thereon, each pair cooperating with the wafer to form a resonating portion. The two dual coupled crystal elements are cascade coupled, with the signal to be selected applied to the first pair of electrodes on the first element, then coupled from the second pair of electrodes of the first element to the first pair of electrodes of the second element, and the selected signal derived from the second pair of electrodes of the second element. To reduce the requirement for inductive coupling elements in the filter, the monolithic filter elements are constructed so that the resonant frequencies of certain resonating portions thereof are below the mesh frequencies of the filter, which are at the center frequency of the filter. To provide a filter response characteristic having improved selectivity, i.e. steep skirts, a capacitor is bridged across the electrodes of at least one of the crystal elements. This causes a non-symmetrical response, and to correct this, the filter elements are constructed so that the resonant frequency of one resonating portion of at least one of the crystal elements is increased.

16 Claims, 4 Drawing Figures

INVENTORS
STANLEY MALINOWSKI,
JAMES L. DAILING &
CRAIG P. SMITH.
BY
Mueller & Aichele
ATTYS.

BANDPASS FILTER INCLUDING MONOLITHIC CRYSTAL ELEMENTS WITH RESONATING PORTIONS SELECTED FOR SYMMETRICAL RESPONSE

BACKGROUND OF THE INVENTION

This invention relates generally to crystal filter circuits and more particularly to a symmetrical bandpass filter circuit including monolithic dual coupled piezoelectric elements. Bandpass filter circuits including monolithic crystal filter elements have been used to provide a high degree of selectivity in a very compact unit. Inasmuch as the electrodes of the resonators and the connections thereto form capacitive terminations, and since it is desired not to use inductors to resonate out such capacitance because of the cost and space required, it has been proposed to construct the filter elements with the individual resonating portions formed by each pair of electrodes to have resonate frequencies below the mesh frequencies of the filter, which are at the center frequency of the filter.

It has also been proposed in filter circuits including monolithic crystal elements to provide a capacitor between the electrodes forming the resonating portions of a wafer to increase the steepness of the sides or skirts of the filter characteristics. However, when such a capacitor is used in a filter wherein the resonating portions are resonate below the mesh frequencies, it has been found that the response characteristic of the filter is not symmetrical with respect to the center frequency. This produces a problem in many applications wherein it is important that the response be symmetrical for proper operation. Further, in filters wherein two or more dual coupled monolithic elements are used in cascade, the non-symmetry of the characteristic becomes more pronounced.

SUMMARY OF THE INVENTION

An object of this invention is to provide an improved crystal filter circuit which includes at least one dual coupled monolithic crystal filter element, and wherein the response characteristic is substantially symmetrical.

Another object of the invention is to provide a monolithic crystal filter including a piezoelectric resonating element with at least two pairs of electrodes thereon and wherein a capacitor is connected between electrodes of the two pairs to steepen the characteristic curve of the filter, with the resonate frequencies of the two resonating portions being selected at different frequencies to provide a symmetrical response.

A further object of the invention is to provide an improved bandpass crystal filter circuit which includes a plurality of monolithic crystal filter elements at least one of which has two resonating portions which have resonant frequencies selected to provide a substantially symmetrical response.

In practicing the invention, a bandpass crystal filter circuit is provided having a plurality of monolithic crystal filter elements each having two pairs of electrodes cooperating with a wafer of piezoelectric material to form two resonating portions. The elements are connected in cascade to provide high selectivity. In accordance with known filter design, the resonating portions are constructed to be resonant at a frequency below the center frequency of the filters, and capacitors are connected thereto to provide filter meshes which are tuned to the center frequency of the filter. A capacitor is coupled across the electrodes of the resonating portions of at least one of the filter elements to steepen the filter response characteristic. However, this has been found to cause the response characteristic to be unsymmetrical. By constructing the monolithic crystal elements so that one of the resonating portions of at least one of the crystal elements is resonant at a higher frequency, the desired symmetrical bandpass characteristic is obtained.

Figure 1:
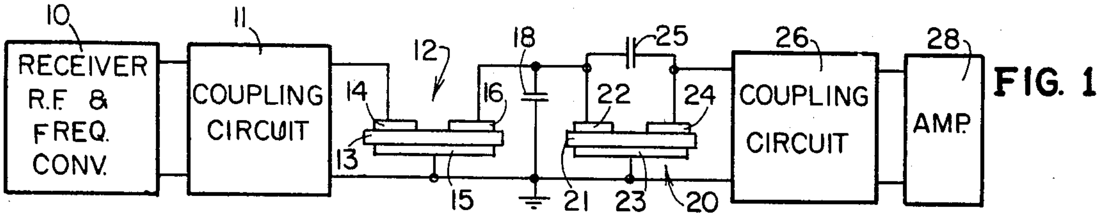
FIG. 1 is a block diagram showing the bandpass filter of the invention used in a radio receiver.

Referring now to the drawing, in FIG. 1 there is shown in block diagram form a filter circuit of the invention as used in a radio receiver. The receiver front end 10, which may includes an antenna circuit, and radio frequency and frequency converting stages, raises the lever of received signals and provides the same at a frequency suitable for selection and amplification. Coupling circuit 11 couples the received signals to the dual coupled monolithic crystal element 12. The crystal element 12 includes a substantially flat wafer 13 of quartz or other piezoelectric material having two pairs of electrodes thereon, the first pair formed by electrodes 14 and 15, and the second pair by electrodes 16 and 15. The electrode 15 may be replaced by two interconnected electrodes, each of which is opposite to, and cooperates with, one of the electrodes 14 and 16, but for simplicity and economy, a single electrode 15 can be used in cooperation with the two separate electrodes 14 and 16.

Signals from coupling circuit 11 are applied to the electrode 14 of crystal element 12, and output signals are derived from the electrode 16. The output signals from the first monolithic crystal element 12 are applied across capacitor 18 and to a second monolithic crystal element 20. The element 20 includes wafer 21 with electrodes 22 and 23 forming the input electrodes, and electrodes 24 and 23 forming the output electrodes. The output signals from the second monolithic crystal elements 20 are applied through the coupling unit 26 to an amplifier 28, which may be the intermediate frequency amplifier of a radio receiver. The signals can then be used as may be desired.

It has been found that the selectivity or shape factor of the filter response can be improved by the use of two dual coupled monolithic crystal filters in cascade. The term "shape factor" refers to the ratio of the filter rejection bandwidth to the pass bandwidth, for example, the ratio at the 50db points to the 3db points. However, a filter characteristic with steeper sides can be provided, as required in a highly selective receiver, by connecting a bridging capacitor 25 between electrodes 22 and 24 of the crystal element 20. There will inherently be capacitance between the electrodes 22 and 24 and between the connections thereto, and the capacitance of the bridging capacitor 25 is added to this capacitance. If still sharper selectivity is required, a second bridging capacitor can be added between the electrodes 14 and 16 of the filter 12 to add to the inherent capacitance therebetween.

Figure 2:
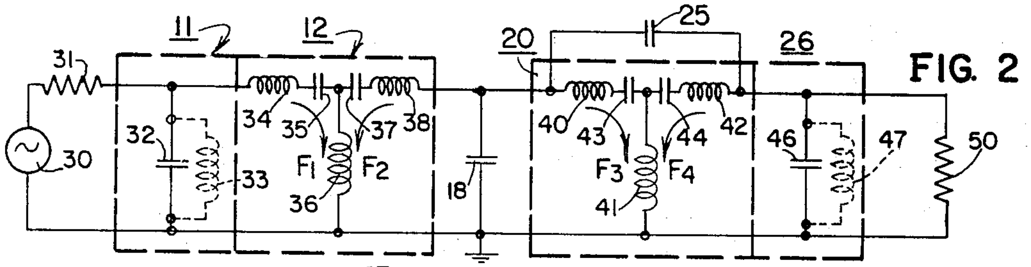
FIG. 2 shows an equivalent circuit for the filter of FIG. 1.

FIG. 2 illustrates the equivalent circuit of the filter including the monolithic crystal filter elements 12 and 20. The input circuit is represented by a signal generator 30 and a series resistor 31. Capacitor 32 forms the coupling circuit 11 of FIG. 1 and cooperates with resistor 31 to provide the proper input termination for the monolithic crystal element 12. Inductor 34, capacitor 35, inductor 36, capacitor 37 and inductor 38 represent the equivalent circuit of the crystal wafer 13 and the electrodes thereon, neglecting parasitic capacities between electrodes. Capacitor 18 provides the coupling between crystal element 12 and element 20, as in FIG. 1. Inductors 40, 41 and 42, and capacitors 43 and 44 represent the equivalent circuit of crystal element 20. Capacitor 46 forms the coupling circuit 26 of FIG. 1, and cooperates with load resistor 50 to provide the output termination. Resistor 50 which forms the load may be the input impedance of an amplifier, as illustrated by the amplifier 28 of FIG. 1.

Because inductors are relatively large and require substantial space, and are relatively expensive components, it is desired to eliminate inductors from the filter circuit where possible. This is particularly important in electronic equipment which uses semiconductors and other miniature components. This is accomplished by constructing the crystal elements so that the resonating portions thereof are resonant at a frequency below the center frequency of the filter. The terminations and coupling element between the crystal elements can then be provided by capacitors which will bring the frequency of the filter meshes up to the center frequency of the filter. For example, the frequencies of the resonating portions of the crystal elements can be of the order of 30 percent of the filter bandwidth (at the 3db points) below the desired center frequency of the filter, and this will not substantially change the selectivity and bandwidth of the filter.

The monolithic filter elements 12 and 20 are constructed so that the mesh $F_1$ formed by the input termination, inductors 34 and 36 and capacitor 35, the mesh $F_2$ formed by inductors 36 and 38 and capacitors 37 and 18, the mesh $F_3$ formed by capacitor 18, inductors 40 and 41 and capacitor 43, and the mesh $F_4$ formed by inductors 41 and 42, capacitor 44 and the output termination, are each tuned to the center frequency of the filter. The coupling capacitor 18 and the terminating capacitors 32 and 46 are formed, at least in part, by the electrode capacitances of the filter elements, and by capacitances of leads connected thereto. In the event that the capacitance of the electrodes, leads, etc. is more than the value which is desired, inductors 33 and 47 can be bridged across capacitors 32 and 46, respectively. Series capacitors can be substituted for the shunt capacitors 32 and 46, if desired.

As previously stated, the addition of a bridging capacitor 25 between the electrodes 22 and 24 of element 20 will steepen the sides of the response characteristic. However, it has been found that the use of the bridging capacitor 25 with a filter as has been described causes the response to become non-symmetrical.

Figure 4:
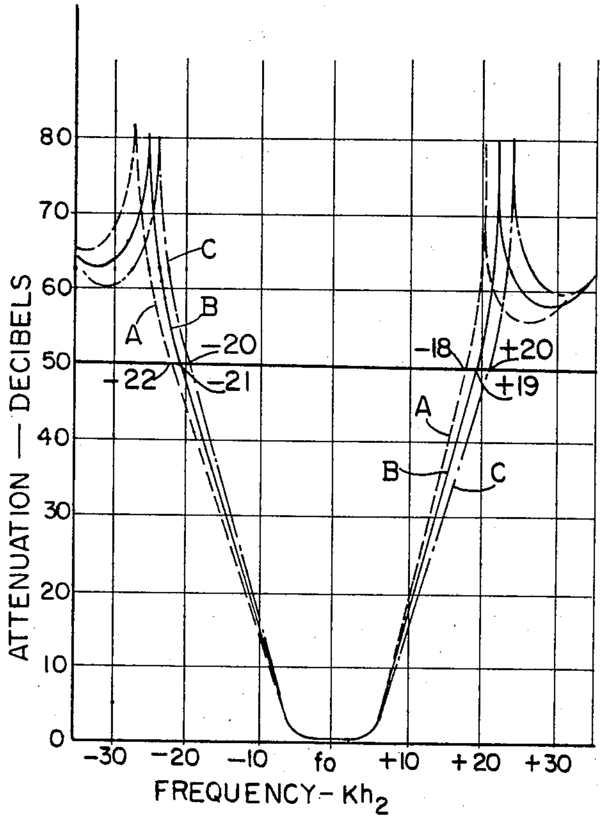
FIG. 4 shows the response characteristic of filters including a pair of cascade coupled monolithic crystal filter elements.

The response of the filter which has been described is shown in FIG. 4, wherein curve A shows the response with all resonating portions of the crystal elements at the same frequency, and resonant below the center frequency of the filter. The response curve shown is for a filter having a center frequency of 11.7 MHz and a bandpass at the 3db points of 13 KHz. The filter as shown in FIGS. 1 and 2, without the use of a bridging capacitor and assuming that there is no inherent capacitance between the separate electrodes of the crystal elements (electrodes 14 and 16 for example), has a monotonic response which is symmetrical. By adding the bridging capacitor, the response becomes non-symmetrical, and infinite attenuation points are produced in the response characteristics. This results in side lobes which may pass signals outside the passband at frequencies and amplitude levels which should be excluded. As shown in FIG. 4, the upper frequency side lobe drops down to the 56db level.

Figure 3:
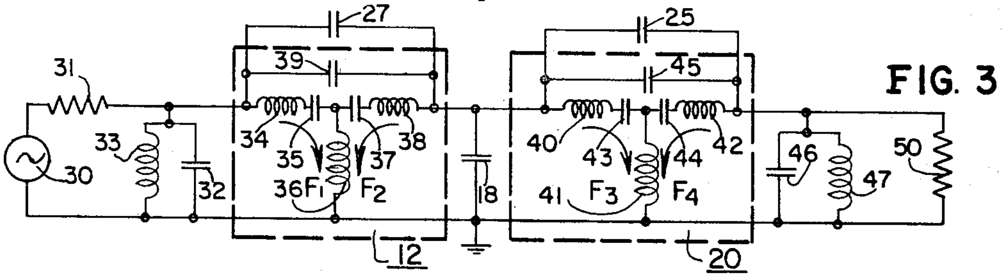
FIG. 3 illustrates the improved crystal filter circuit of the invention.

FIG. 3 illustrates substantially the same circuit as shown in FIG. 2, with the inherent capacity between the separate electrodes on each monolithic filter being shown as a separate element. The inherent capacitance between electrodes 14 and 16 of crystal element 12 is indicated as 39, and the inherent capacitance between electrodes 22 and 24 of crystal element 20 as indicated as 45. The bridging capacitor 25 increases the capacitance between electrodes 22 and 24 of crystal element 20. A second bridging capacitor 27 is shown connected across the electrodes of crystal element 12, adding to the inherent capacitance therebetween.

In the circuit of FIG. 3, the frequency of the inner meshes $F_2$ and $F_3$ formed by resonating portions of the crystal elements 12 and 20 is about 3.7 KHz below the center frequency of the filter (11.7 MHz). This is slightly less than 30 percent of the bandwidth below the center frequency of the filter, and is in accordance with the design described above. Since the capacitor 18 must have a certain value to provide the required coupling between the elements 12 and 20 for a particular filter design, the resonating portions of the crystal elements are constructed so that the frequency of the meshes $F_2$ and $F_3$ in cooperation with capacitor 18 are brought to the center frequency, or 11.7 MHz. To retain the same basic filter design, the coupling between the two monolithic crystal elements, represented by the capacitor 18 in FIGS. 1, 2 and 3, can not be changed, as this will introduce other changes in characteristic and unduly complicate the filter design. Also when more than two crystal elements are used, the inner element or elements, and the couplings thereto, are normally not changed.

In accordance with the invention, the crystal element 20, across which the bridging capacitor 25 is connected, is constructed so that the frequency of the resonating portion thereof which is included in the outer mesh $F_4$ is increased to substantially the center frequency of the filter, or 11.7 MHz. That is, the crystal element 20 has one resonating portion resonant at one frequency and another resonating portion at a different frequency, which is known as a polarized crystal element. The crystal elements previously described in connection with FIGS. 1 and 2, wherein both resonating portions are at the same resonant frequency, are known as non-polarized crystal elements. Since the resonating portion forming mesh $F_4$ is now at the center frequency, the end termination should be nonreactive, so that inductor 47 is required to resonate out the capacitance of capacitor 46. The frequency of the resonant portion of crystal element 12 which is in the mesh $F_1$ may also be increased to substantially the center frequency of the filter, and the termination thereof should also be nonreactive requiring inductor 33 to resonate out the capacity of capacitor 32.

The response curve of the filter which has just been described is shown by curve B in FIG. 4. This is the solid line curve, and it will be apparent that curve B is more symmetrical than curve A. The lower side of the response curve B crosses the 50db points at −21 KHz and the upper side crosses at +19 KHz. Curve A, on the other hand, crosses the 50db on the lower side at −22 KHz and on the upper side at +18 KHz. The non-symmetrical characteristic of the response curve is therefore substantially reduced. Also, the minimum side lobe is at a point of greater attenuation, with the lobe at a positive side which drops down to the 56db point in curve A being above the 58db point in curve B.

It has also been found that if the frequency of the resonating portions forming the meshes $F_1$ and $F_4$ is further increased to a frequency above the center frequency of the filter by an amount which is substantially the same that the resonating portions forming the meshes $F_2$ and $F_3$ are below the center frequency, the response curve becomes still more symmetrical. In such case, the frequency of the resonating portions forming the meshes $F_2$ and $F_3$ will be about 3.7 KHz below the center frequency of 11.7 MHz, and the frequency of the meshes $F_1$ and $F_4$ will be about 3.7 KHz above the center frequency of 11.7 MHz. In this case the inner meshes $F_2$ and $F_3$ will require a capacitive coupling as in the preceding example, and this is provided by capacitor 18. The outer meshes $F_1$ and $F_4$ will require inductive terminations rather than nonreactive terminations. This can be accomplished by changing the values of the inductors 33 and 47 which are provided across the capacitors 32 and 46. It may be desirable to use fixed inductors 33 and 47 and adjustable capacitors 32 and 46 to tune the coupling circuits to provide the desired inductive terminations.

FIG. 4 shows in curve C, the response curve of the filter which has just been described, and wherein the resonating portions forming meshes $F_2$ and $F_3$ are below the center frequency, and the resonating portions forming meshes $F_1$ and $F_4$ are above the center frequency by substantially the same amount. In this case, the average frequency of the resonating portion is at the center frequency. It will be noted that in curve C of FIG. 4, the 50db points are 20 KHz below and 20 KHz above the center frequency of the filter. Also, the side lobes are above the 60db points on both the upper and lower sides of the filter bandpass. Accordingly, the response curve is almost completely symmetrical.

The filter as shown in FIG. 3, wherein the resonating portions of the monolithic crystal elements which are in the inner meshes are resonant below the center frequency by about 30 percent of the bandwidth, and wherein the resonating portions which are in the outer meshes are substantially at the center frequency, has a significantly improved symmetry with respect to the filter wherein all of the resonating portions are below the center frequency. This filter configuration has been found to be relatively insensitive to the termination impedances so that it can be used in commercial applications without requiring critical component values and precise alignment of the circuit. The filter configuration wherein the resonating portions forming the outer meshes are above the center frequency by about the same amount that the resonating portions forming the inner meshes are below the center frequency has improved symmetry and is highly desirable for applications wherein the response curve must be extremely symmetrical. It has been found that this filter is somewhat sensitive to the terminating impedances, and in applications wherein the other components of the equipment to which the filter is connected are subject to significant variations, the filter having the outer meshes at the center frequency may be preferable.

The two filter constructions described in connection with FIG. 3 provides bandpass characteristics which are more symmetrical than that of filters wherein the resonating portion forming all of the meshes of the two dual coupled monolithic crystal elements are at the same frequency, below the center frequency of the filter. These constructions have been found to be quite advantageous for use in highly selective radio receivers.

We claim:

1. A monolithic filter for providing a symmetrical response about a given center frequency including a piezoelectric resonating element having first and second opposite sides with first and second pairs of electrodes thereon and the electrodes of each pair being on opposite sides of the resonating element, means coupled to said first pair of electrodes for applying signals thereto, means coupled to said second pair of electrodes for deriving selected signals therefrom, and capacitor means connected between one electrode of each pair which is on the same side of said resonating element, said resonating element and said first pair of electrodes thereon being constructed to be resonant at a first frequency below the center frequency of the filter, and said resonating element and said second pair of electrodes thereon being constructed to be resonant at a second frequency above said first frequency.

2. A filter in accordance with claim 1 wherein said second frequency is substantially the center frequency of the filter.

3. A filter in accordance with claim 1 wherein said second frequency is above the center frequency of the filter.

4. A filter in accordance with claim 3 wherein said second frequency is above the center frequency of the filter by substantially the same amount that said first frequency is below the center frequency.

5. A monolithic crystal filter circuit for providing a symmetrical bandpass about a given center frequency, including in combination, first and second piezoelectric crystal elements each having first and second spaced pairs of electrodes thereon forming first and second resonating portions coupled through the crystal element, means coupled to said first pair of electrodes of said first element for applying signals thereto, means coupled to said second pair of electrodes of said first element and to said first pair of electrodes of said second element for coupling signals from said first element to said second element, means coupled to said second pair of electrodes of said second elements for deriving selected signals therefrom, said second resonating portions of said first element and said first resonating portions of said second element being constructed to be resonant at a first frequency below the center frequency of the filter, and capacitor means connected between said first and second pairs of electrodes of one of said piezoelectric elements, said one piezoelectric element having a resonating portion thereof constructed to be resonant at a second frequency above said first frequency.

6. A filter in accordance with claim 5 wherein said first frequency is below the center frequency of the filter by an amount of the order of 30 percent of the bandwidth of the filter circuit.

7. A filter in accordance with claim 5 wherein said second frequency is substantially the center frequency of the filter.

8. A filter in accordance with claim 5 wherein said second frequency is above the center frequency of the filter.

9. A filter in accordance with claim 8 wherein said second frequency is above the center frequency of the filter by substantially the same amount that said first frequency is below the center frequency thereof.

10. A filter in accordance with claim 5 wherein said capacitor means is connected between said first and second pairs of electrodes of said second element, and said second resonating portion of said second element is constructed to be resonant at said second frequency.

11. A filter in accordance with claim 10 wherein said first resonating portion of said first element is constructed to be resonant at a frequency above said first frequency.

12. A filter in accordance with claim 10 wherein said first resonating portion of said first element is constructed to be resonant at said second frequency, and said second frequency is at substantially the center frequency of the filter.

13. A filter in accordance with claim 10 wherein said second frequency is above the center frequency of the filter, and said first resonating portion of said first element is constructed to be resonant at a frequency above the center frequency of the filter.

14. A filter in accordance with claim 5 including first and second capacitor means connected between said first and second pairs of electrodes of said first and second elements, respectively, and wherein said first resonating portion of said first element and said second resonating portion of said second element are constructed to be resonant above said first frequency.

15. A filter in accordance with claim 14 wherein said first resonating portion of said first element and said second resonating portion of said second element are resonant above the center frequency of the filter.

16. A filter in accordance with claim 14 wherein said first resonating portion of said first element and said second resonating portion of said second element are resonant above the center frequency of the filter by substantially the same amount said first frequency is below the center frequency of the filter.

* * * * *